(12) United States Patent
Dennison et al.

(10) Patent No.: US 6,673,700 B2
(45) Date of Patent: Jan. 6, 2004

(54) REDUCED AREA INTERSECTION BETWEEN ELECTRODE AND PROGRAMMING ELEMENT

(75) Inventors: Charles H. Dennison, San Jose, CA (US); Guy C. Wicker, Santa Clara, CA (US); Tyler A. Lowrey, San Jose, CA (US); Stephen J. Hudgens, Santa Clara, CA (US); Chien Chiang, Fremont, CA (US); Daniel Xu, Mountain View, CA (US)

(73) Assignee: Ovonyx, Inc., Boise, ID (US)

( * ) Notice: Subject to any disclaimer, the term of this patent is extended or adjusted under 35 U.S.C. 154(b) by 0 days.

(21) Appl. No.: 09/895,020

(22) Filed: Jun. 30, 2001

(65) Prior Publication Data

US 2003/0003691 A1 Jan. 2, 2003

(51) Int. Cl.[7] .................. H01L 21/326; H01L 21/479
(52) U.S. Cl. ........................... 438/466; 438/573
(58) Field of Search ................ 438/254, 255, 438/397, 398, 466, 523, 517, 533, 573

(56) References Cited

U.S. PATENT DOCUMENTS

| 5,296,716 A | 3/1994 | Ovshinsky et al. |
| 5,789,758 A | 8/1998 | Reinberg |
| 5,879,955 A | 3/1999 | Gonzalez et al. |
| 5,920,788 A | 7/1999 | Reinberg |
| 5,933,365 A | 8/1999 | Klersy et al. |
| 5,970,336 A | 10/1999 | Wolstenhome et al. |
| 5,998,244 A | 12/1999 | Wolstenholme et al. |
| 6,002,140 A | 12/1999 | Gonzalez et al. |
| 6,031,287 A | 2/2000 | Harshfield |
| 6,087,674 A | 7/2000 | Ovshinsky et al. |
| 6,153,890 A | 11/2000 | Wolstenholme et al. |
| 6,229,157 B1 | 5/2001 | Sandhu |
| 6,312,986 B1 * | 11/2001 | Hermes |

* cited by examiner

*Primary Examiner*—Phuc T. Dang
(74) *Attorney, Agent, or Firm*—Trop, Pruner & Hu, P.C.

(57) ABSTRACT

A method comprising forming a sacrificial layer over less than the entire portion of a contact area on a substrate, the sacrificial layer having a thickness defining an edge over the contact area, forming a spacer layer over the spacer, the spacer layer conforming to the shape of the first sacrificial layer such that the spacer layer comprises an edge portion over the contact area adjacent the first sacrificial layer edge, removing the sacrificial layer, while retaining the edge portion of the spacer layer over the contact area, forming a dielectric layer over the contact area, removing the edge portion, and forming a programmable material to the contact area formerly occupied by the edge portion. An apparatus comprising a volume of programmable material, a conductor, and an electrode disposed between the volume of programmable material and the conductor, the electrode having a contact area at one end coupled to the volume of programmable material, wherein the contact area is less than the surface area at the one end.

14 Claims, 18 Drawing Sheets

US 6,673,700 B2

REDUCED AREA INTERSECTION BETWEEN ELECTRODE AND PROGRAMMING ELEMENT

BACKGROUND

1. Field

Programmable devices, including phase change memory devices that can be programmed by modifying the state of a phase change material.

2. Background

Typical computers, or computer related devices, include physical memory, usually referred to as main memory or random access memory (RAM). Generally, RAM is memory that is available to computer programs and read-only memory (ROM) is memory that is used, for example, to store programs that boot a computer and perform diagnostics. Typical memory applications include dynamic random access memory (DRAM), static random access memory (SRAM), erasable programmable read-only memory (EPROM), and electrically erasable programmable read-only memory (EEPROM).

Solid state memory devices typically employ microelectronic circuit elements for each memory bit (e.g., one to six transistors per bit) in memory applications. Since one or more electronic circuit elements are required for each memory bit, these devices may consume considerable chip "real estate" to store a bit of information, which limits the density of a memory chip. The primary "non-volatile" memory element of these devices, such as an EEPROM, typically employ a floating gate field effect transistor device that has limited re-programmability and which holds a charge on the floating gate of the field effect transistor to store each memory bit. These classes of memory devices are also relatively slow to program and even slower when an erase cycle is required prior to programming as would be the case for truly random writes.

Phase change memory devices use phase change materials, i.e., materials that can be switched between a generally amorphous and a generally crystalline state, for electronic memory application. One type of memory element originally developed by Energy Conversion Devices, Inc. of Troy, Mich. utilizes a phase change material that can be, in one application, electrically switched between a structural state of generally amorphous and generally crystalline local order or between different detectable states of local order across the entire spectrum between completely amorphous and completely crystalline states. Typical materials suitable for such application include those utilizing various chalcogenide elements. These memory devices typically do not use field effect transistor devices or capacitors as the memory storage element, but comprise, in the electrical context, a monolithic body of thin film chalcogenide material. As a result, very little chip real estate is required to store a bit of information, thereby providing for inherently high density memory chips. The state change materials are also truly non-volatile in that, when set in either a crystalline, semi-crystalline, amorphous, or semi-amorphous state representing a resistance value, that value is retained until reprogrammed as that value represents a physical state of the material (e.g., crystalline or amorphous). Thus, phase change memory materials represent a significant improvement in non-volatile memory.

One characteristic common to solid state and phase change memory devices is significant power consumption particularly in setting or resetting memory elements. Power consumption is significant, particularly in portable devices that rely on power cells (e.g., batteries). It would be desirable to decrease the power consumption of a memory device.

DETAILED DESCRIPTION

In one embodiment, a technique for forming an area of intersection (a contact area) between an electrode and a programming element. By this technique, the area of intersection is not limited by the limitations associated with photolithography, notably feature size limitations. In general, the contact areas are defined in terms of film thickness rather than photolithography, which allows miniaturization beyond the feature size limits of photolithography. In terms of minimizing the contact area between a programmable material such as a phase change material and an electrode, minimizing the contact area reduces the power consumption necessary to program the phase change material.

In the following paragraphs and in association with the accompanying figures, an example of a memory array and a memory device is presented. The embodiment describes the programmable material including a phase change material when the phase of the material determines the state of the memory element.

Figure 1:
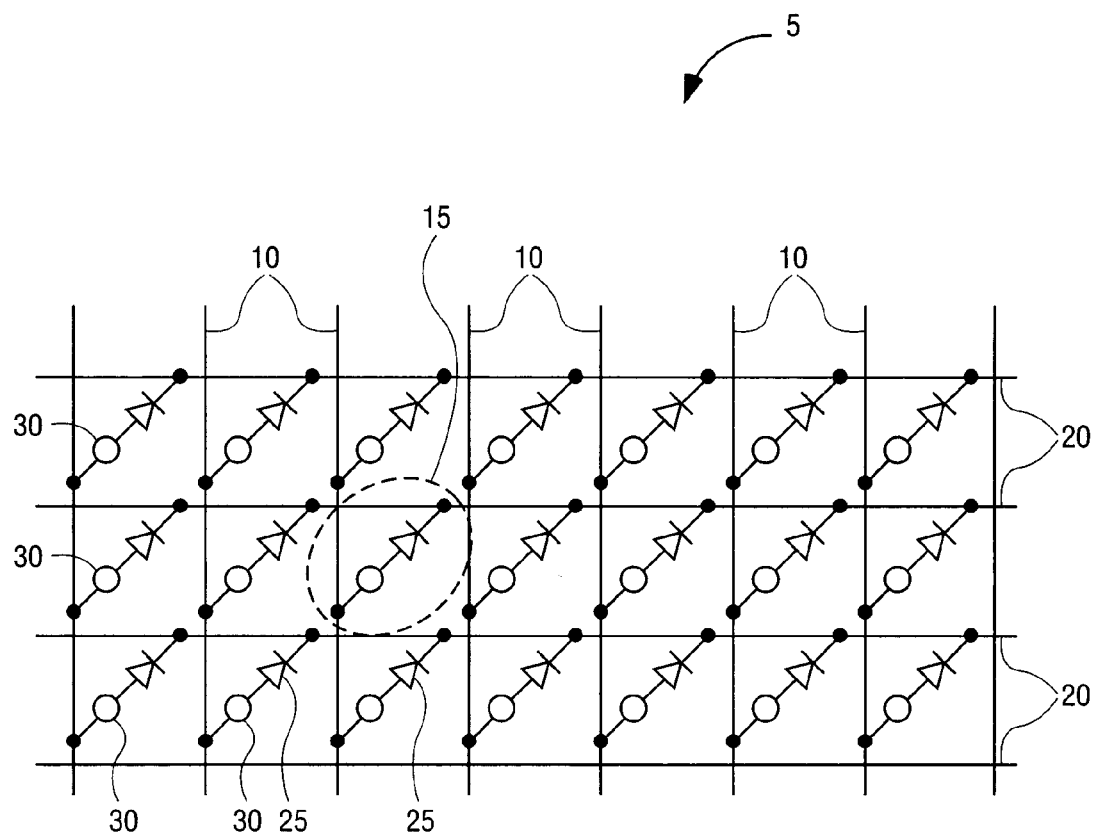
FIG. 1 is a schematic diagram of an array of memory elements.

FIG. 1 shows a schematic diagram of an embodiment of a memory array comprised of a plurality of memory elements presented and formed in the context of the invention. In this example, the circuit of memory array 5 includes an xy grid with memory element 30 electrically interconnected in series with isolation device 25 on a portion of a chip. Address lines 10 (e.g., columns) and 20 (e.g., rows) are connected, in one embodiment, to external addressing circuitry. One purpose of the xy grid array of memory elements in combination with isolation devices is to enable each discrete memory element to be read and written without interfering with the information stored in adjacent or remote memory elements of the array.

A memory array such as memory array 5 may be formed in a portion, including the entire portion, of a substrate. A typical substrate includes a semiconductor substrate such as a silicon substrate. Other substrates including, but not limited to, substrates that contain ceramic material, organic material, or glass material as part of the infrastructure are also suitable. In the case of a silicon semiconductor substrate, memory array 5 may be fabricated over an area of the substrate at the wafer level and then the wafer reduced through singulation into discrete die or chips, some or all of the die or chips having a memory array formed thereon. Additional addressing circuitry (e.g., decoders, etc.) may be formed in a similar fashion.

Figure 2:
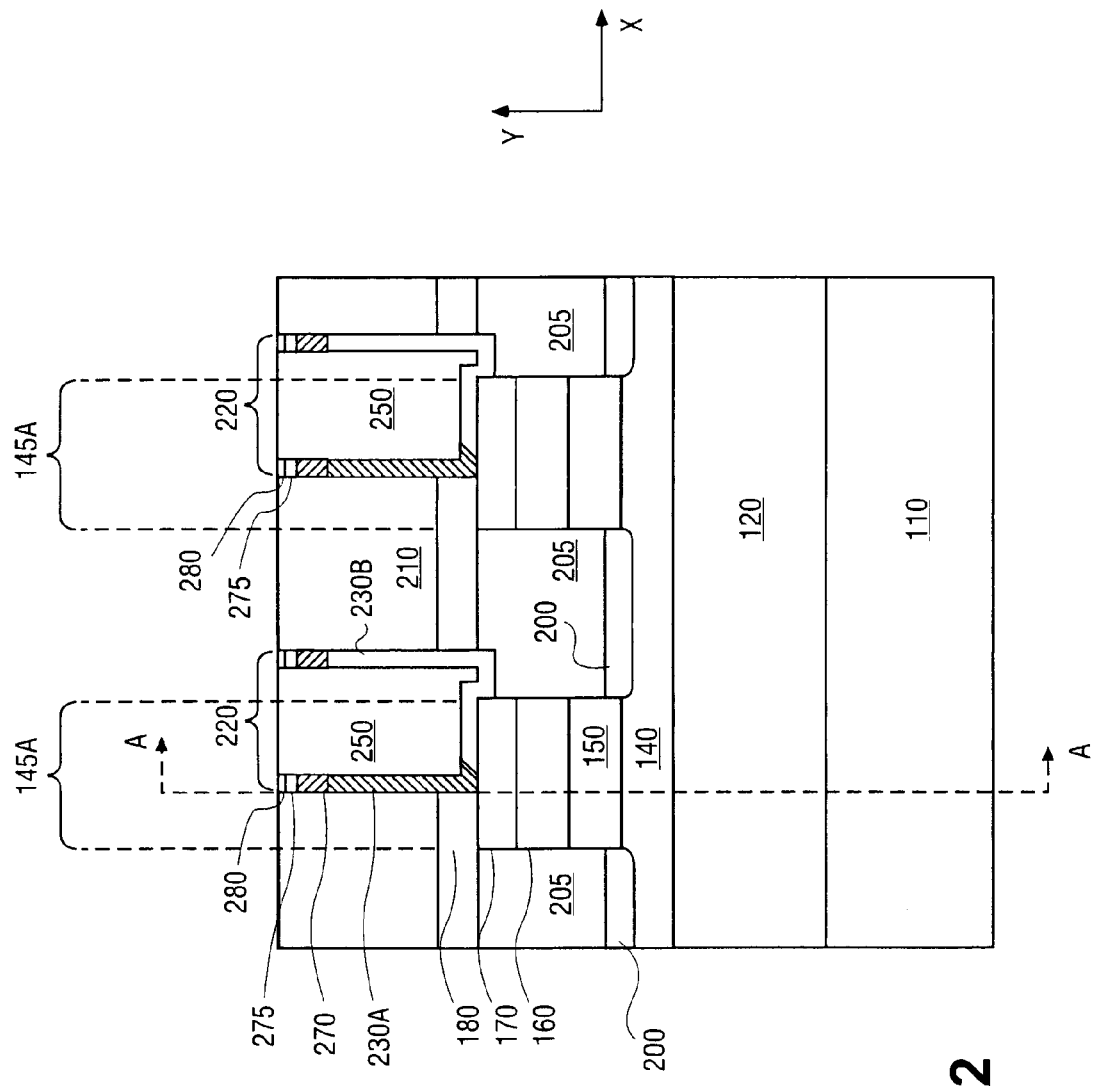
FIG. 2 schematically shows a cross-sectional planar side view of a portion of a substrate having electrodes coupled to conductors or signal lines on the substrate as a portion of an embodiment of memory cell element.
Figure 3:
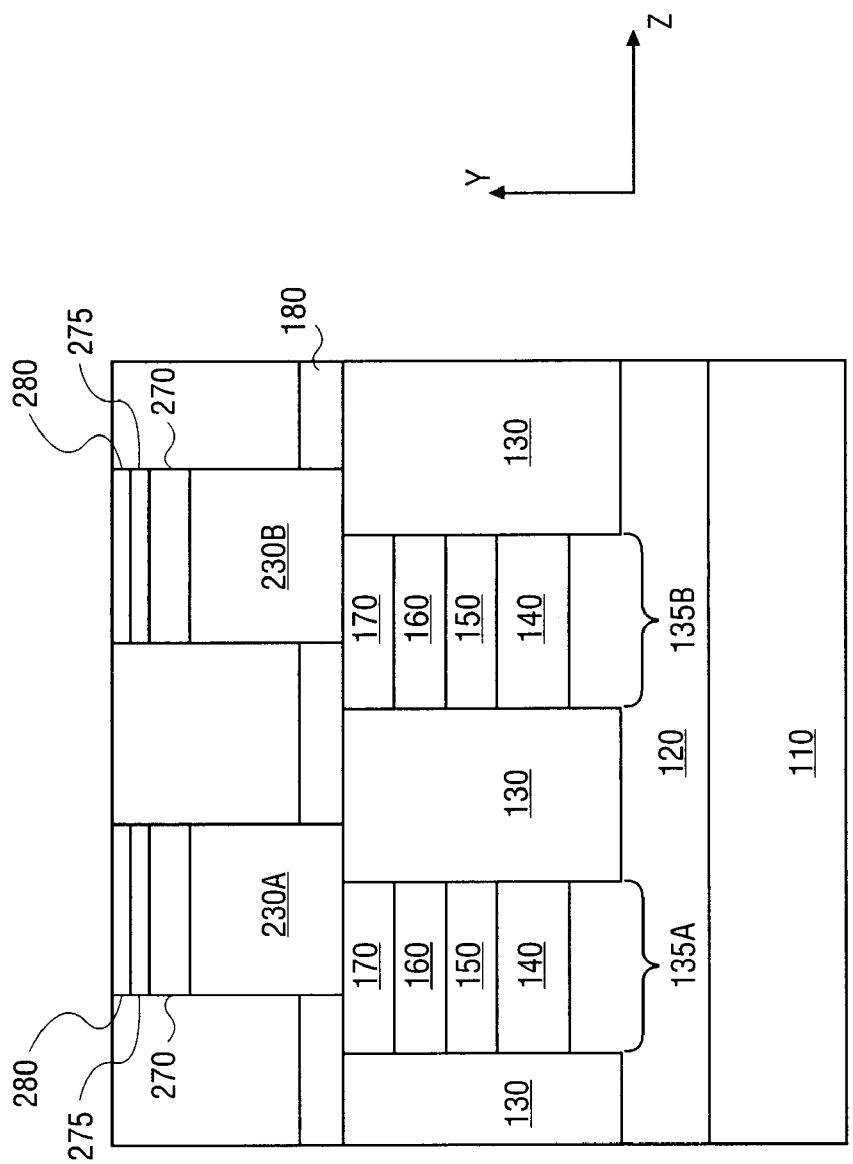
FIG. 3 shows a cross-sectional planar side view through line A–A' of FIG. 2.

FIGS. 2–19 illustrate an embodiment of the fabrication of representative memory element 15 of FIG. 1. FIG. 2 and FIG. 3 show a structure from an xy-direction and a yz-direction, respectively. FIG. 2 and FIG. 3 show a portion of a memory element (e.g., memory element 15) including, as will be described, a signal line or conductor (e.g., row line 20 of FIG. 1), an isolation device (e.g., isolation device 25 of FIG. 1) and an electrode.

Referring to FIG. 2 and FIG. 3, there is shown a portion of substrate 100 that is, for example, a semiconductor substrate. In this example, a P-type dopant such as boron is introduced in portion 110. In one example, a suitable concentration of P-type dopant is on the order of above $5 \times 10^{19} - 1 \times 10^{20}$ atoms per cubic centimeters (atoms/cm$^3$) rendering portion 110 of substrate 100 representatively P$^{++}$. Overlying portion 110 of substrate 100, in this example, is portion 120 of P-type epitaxial silicon. In one example, the dopant concentration is on the order of about $10^{16}-10^{17}$ atoms/cm$^3$.

FIG. 3 shows shallow trench isolation (STI) structures 130 formed in epitaxial portion 120 of substrate 100. As will become apparent in the subsequent discussion, STI structures 130 serve, in one aspect, to define the z-direction thickness of a memory element cell, with at this point only the z-direction thickness of a memory element cell defined. In another aspect, STI structures 130 serve to isolate individual memory elements from one another as well as associated circuit elements (e.g., transistor devices) formed in and on the substrate.

FIG. 3 also shows memory cell regions 135A and 135B introduced as strips with the x-direction dimension greater than the z-direction dimension. Overlying epitaxial portion 120 of substrate 100 is first conductor or signal line material 140. In one example, first conductor or signal line material 140 is N-type doped silicon formed by the introduction of, for example, phosphorous or arsenic to a concentration on the order of about $10^{18}-10^{19}$ atoms/cm$^3$ (e.g., N$^+$ silicon). In this example, first conductor or signal line material 140 serves as an address line, a row line (e.g., row line 20 of FIG. 1). Overlying first conductor or signal line material 140 is an isolation device (e.g., isolation device 25 of FIG. 1). In this example, the isolation device is a PN diode formed of N-type silicon portion 150 (dopant concentration on the order of about $10^{17}-10^{18}$ atoms/cm$^3$) and P-type silicon portion 160 (dopant concentration on the order of about $10^{19}-10^{20}$ atoms/cm$^3$). Although a PN diode is shown, it is to be appreciated that other isolation structures are similarly suitable. Such devices include, but are not limited to, metal oxide semiconductor (MOS) devices.

Following the formation of first conductor or signal line 140 and isolation device 25, the x-direction dimension of memory cells 145A and 145B may be formed, again by STI techniques. FIG. 2 shows trenches formed adjacent memory cells 145A and 145B. Following trench formation, N-type dopant may be introduced between memory cells (e.g., between memory cells 145A and 145B) to form pockets 200 having a dopant concentration on the order of about $10^{18}$ to $10^{20}$ atoms/cm$^3$ (e.g., N$^-$ region). FIG. 2 also shows dielectric material 205 of, for example, silicon dioxide as STI structures between memory cells 145A and 145B.

Referring to FIG. 2 and FIG. 3, overlying the isolation device (e.g., isolation device 25) in each of memory cell 145A and 145B is reducer material 170 of, in this example, a refractory metal silicide such as cobalt silicide (CoSi$_2$). Reducer material 170, in one aspect, serves as a low resistance material in the fabrication of peripheral circuitry (e.g., addressing circuitry) of the circuit structure on the chip in this instance. Thus, reducer material 170 is not required in terms of forming a memory element as described. Nevertheless, because of its generally low resistance property, its inclusion as part of the memory cell structure between isolation device 25 and memory element 30 (see FIG. 1) is utilized in this embodiment. Reducer material 170 may be formed by introducing a refractory metal (e.g., cobalt) into a portion of P-type silicon portion 160.

Referring to FIG. 2, dielectric material 180 overlies reducer material 170 and serves, in one embodiment, as an etch stop for a subsequent opening to reducer material 170. Dielectric material 180 is, for example, silicon nitride (Si$_3$N$_4$).

Referring to FIG. 2 and FIG. 3, dielectric material 210 is introduced over the structure to a thickness on the order of 100 Å to 50,000 Å; enough to encapsulate the memory cell material and to define (possibly after planarization) a y-direction thickness (height) of an electrode material. In one embodiment, dielectric material 210 is silicon dioxide (SiO$_2$). In another embodiment, dielectric material 210 is a material selected for its reduced thermal conductivity, κ, preferably a thermal conductivity less than $\kappa_{SiO_2}$, more preferably three to 10 times less $\kappa_{SiO_2}$. As a general convention, $SiO_2$ has a κ value on the order of 1.0. Thus, optional materials for dielectric material 210 include those materials that have κ values less than 1.0. Certain high temperature polymers having κ values less than 1.0, carbide materials, Aerogel, Xerogel (κ on the order of 0.1) and their derivatives.

Referring to FIG. 2, trenches are formed through dielectric material 210 and masking material 180 to reducer material 170. An electrode material of, for example, polycrystalline semiconductor material such as polycrystalline silicon is then conformally introduced along the side walls of the trench. Other suitable materials include carbon and semi-metals such as transition metals including, but not limited to, titanium, titanium-tungsten (TiW), titanium nitride (TiN), titanium aluminum nitride (TiAlN), tungsten-nitride (WN), and titanium-silicon nitride (TiSiN). The introduction is conformal in the sense that electrode material 230 is introduced along the side walls and base of trench 220 such that electrode material 230 is in contact with reducer material 170.

In the example described, it is preferable that only a portion of the electrode material extending in the figures in a y-direction, i.e., only one of two "leg portions" extending in a y-direction, constitutes the area of contact with the subsequently introduced memory material. Accordingly, in the case of non-conductive material selected for electrode material 230, such as intrinsic polycrystalline silicon, one of the two leg portions of electrode material 230 is rendered conductive for a conductive path to first conductor or signal line material 140. For polycrystalline silicon for electrode material 230, the conductivity of the material may be increased by doping techniques, by for example angled ion implantation into the desired leg portion. In the case of conductive material selected for electrode material 230, an otherwise conductive path between the non-selected leg portion and first conductor or signal line material 140 may be terminated by, for example introducing a dielectric material between the electrode material and the memory material or by removing a portion of the electrode material by, for example, etching.

FIG. 2 shows the structure where only one of the leg portions of the electrode material serves as a conductive path between first conductor or signal line material 140 and a subsequently introduced memory material. In this example, electrode material 230 is a generally non-conductive intrinsic polycrystalline silicon. After the introduction of a dopant into a portion of electrode material 230, two portions are defined, electrode material 230A and electrode material 230B. As illustrated, electrode material 230A is doped about its length from reducer material 170 and will act as a conductive path between first conductor or signal line material 140 and subsequently introduced memory material. Electrode material 230B is generally non-conductive (e.g., predominantly intrinsic polycrystalline silicon) and thus will generally not serve as a conductive path.

FIG. 2 also shows the introduction of dielectric material 250 into trenches 220. In one embodiment, dielectric material 250 is silicon dioxide ($SiO_2$). In another embodiment, dielectric material 250 is a material that has a thermal conductivity, κ, that is less than the thermal conductivity of $SiO_2$, $\kappa_{SiO_2}$ preferably three to 10 times less than $\kappa_{SiO_2}$. Following introduction, the structure is subjected to a planarization that removes the horizontal component of electrode material 230. Suitable planarization techniques include those known to those of skill in the art, such as chemical or chemical-mechanical polish (CMP) techniques.

Modifying species may be introduced into a portion of electrode material 230A to raise the local resistance of electrode material 230A at portion 270 of the electrode material. Electrode material portion 270 of polycrystalline silicon and $SiO_2$, $Si_3N_4$, $Si_xO_yN_z$, or SiC generally has a higher resistivity than doped polycrystalline silicon of electrode material 230A. Suitable materials for modifying species also include those materials that are introduced (e.g., added, reacted, or combined) into electrode material 230A and raise the resistivity value within the electrode (e.g., raise the local resistance near a volume of memory material), and the resistivity value is also stable at high temperatures. Such modifying species may be introduced by way of implantation or thermal means with, for example, a gaseous ambient.

FIG. 2 still further shows the structure with the electrode having optional barrier materials 275 and 280. Barrier material 275 is, for example, titanium silicide ($TiSi_2$) introduced to a thickness on the order of about 100–300 Å. Barrier material 280 is, for example, titanium nitride (TiN) similarly introduced to a thickness on the order of about 25–300 Å.

Figure 4:
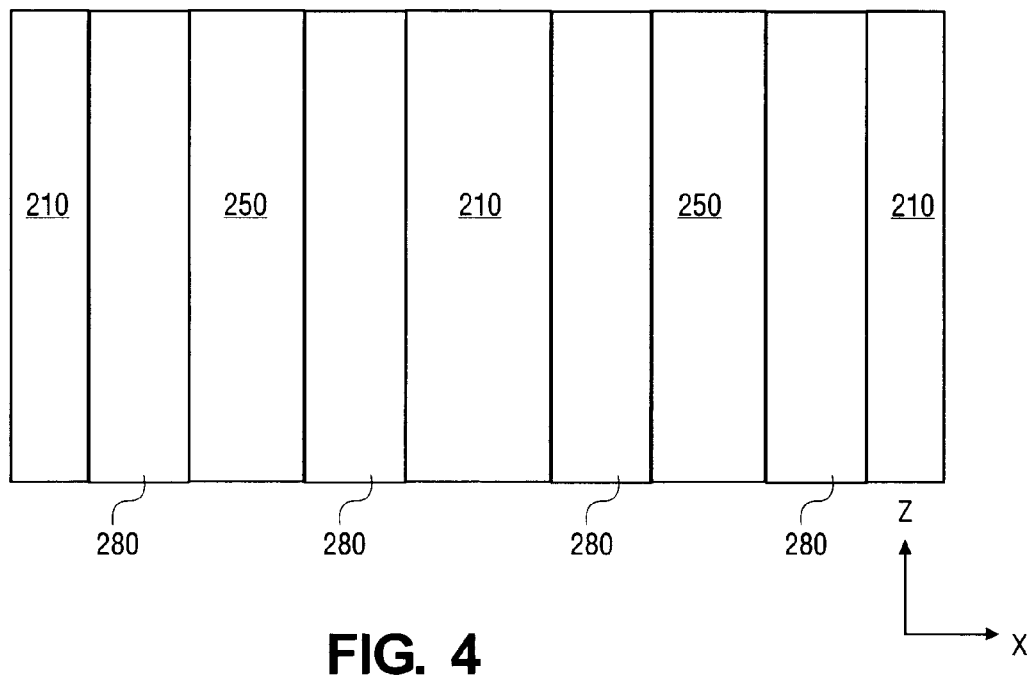
FIG. 4 shows a planar top view of the structure of FIG. 2.

FIG. 4 shows a planar top view of the structure of FIG. 2 and FIG. 3. In this view, electrode material (illustrated by barrier material 280) is formed in strips through a portion of the structure. Programmable material will be formed on electrode material 280. In one embodiment, it is desired to minimize the contact area between electrode material and subsequently formed programmable material. As used herein, the terminology "area of contact" or "contact area" is the portion of the surface of an electrode contact to which the electrode material electrically communicates with the programmable material. In one embodiment, substantially all electrical communication between the programmable material and the electrode material occurs through all or a portion of an edge of the electrode material. That is, only an edge or a portion of an edge of the electrode material is adjacent to the programmable material. The electrode material need not actually physically contact the programmable material. It is sufficient that the electrode material is in electrical communication with the programmable material. In one aspect, it is desired to reduce the area of contact of the electrode material to the programmable material.

Figure 5:
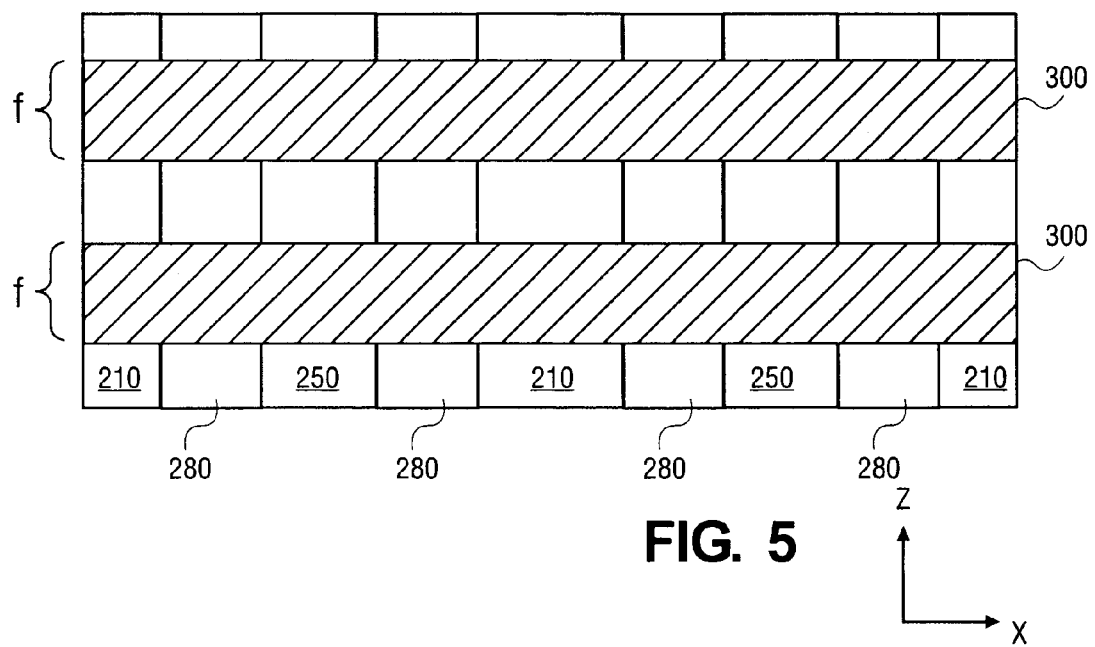
FIG. 5 shows a planar top view of the structure of FIG. 4 following the introduction and patterning of masking material over the structure.

Referring to FIG. 5, in one embodiment, the "strips" of electrode material are partitioned to reduce the area of contact (contact area) between subsequently formed programmable material and the electrode material. In one embodiment, it is desired to reduce the area of contact by minimizing the area of electrode material to a minimal feature size. According to current technology, a minimal feature size using photolithographic techniques is approximately 0.25 microns (μm). FIG. 5 shows the structure of FIG. 4 following the introduction of masking material 300 over a surface of the structure patterned, in one example, to define a feature size, f, of electrode material available for contact to programmable material.

Figure 6:
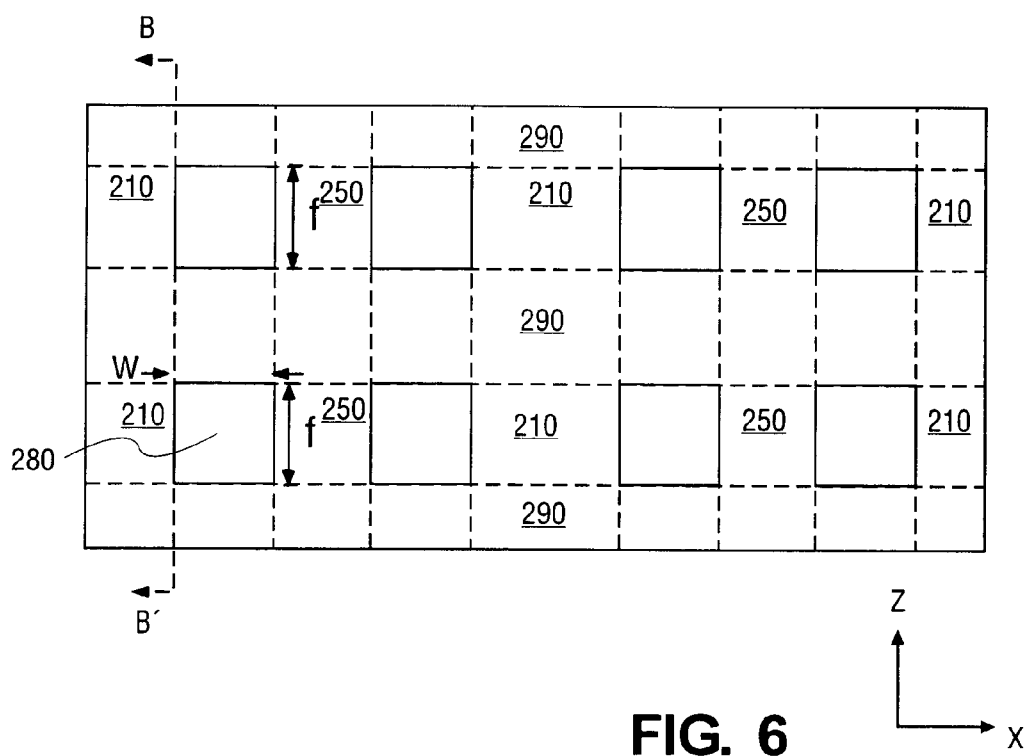
FIG. 6 shows the structure of FIG. 5 after forming trenches in the structure according to the patterned masking material, removing the masking material, and forming a dielectric in the trenches.

Forming the electrode material of the desired feature size involves, in one embodiment, etching to partition the electrode material from strips into individual units. FIG. 6 shows the structure of FIG. 5 following the patterning (e.g., etching) of electrode material. Following etching, dielectric material 290 of, for example, silicon dioxide ($SiO_2$) is introduced (e.g., by chemical vapor deposition (CVD)). At this point, the surface of the structure is planarized.

In the representation shown in FIG. 6, the electrode material strips have been partitioned into area portions each having a width, w, equivalent to the thickness of the deposited electrode layer or film, and a length, f, equivalent to the feature size following photolithographic patterning. Thus, the minimal area is determined by the photolithographic minimum. Thus, the area of contact, at this point, would be the width, w, times the feature size, f. A representative width, w, for an electrode material film according to current technologies is on the order of 250 angstroms (Å).

Figure 7:
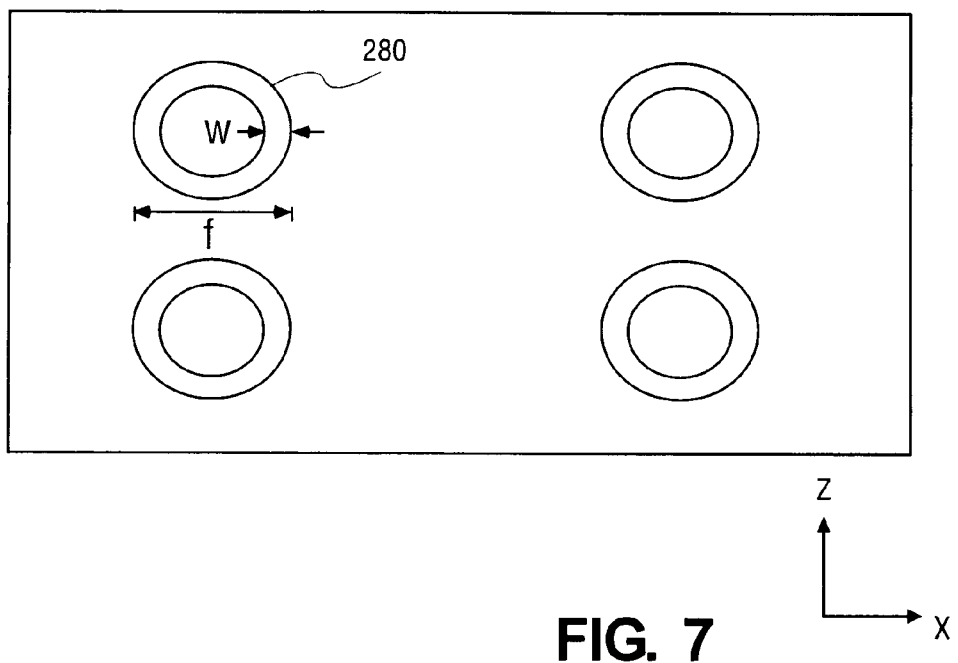
FIG. 7 shows a planar top view of an alternative embodiment of electrodes formed on a substrate, such as a substrate described above with reference to FIG. 2.

FIG. 7 shows an alternative embodiment wherein the electrode material is patterned as circular rings by, for example, depositing electrode material along the side walls of circular trench openings. In this case, the formed circular openings have a feature size, f. The minimal electrode area for contact with a programmable material is π×f×w.

Figure 8:
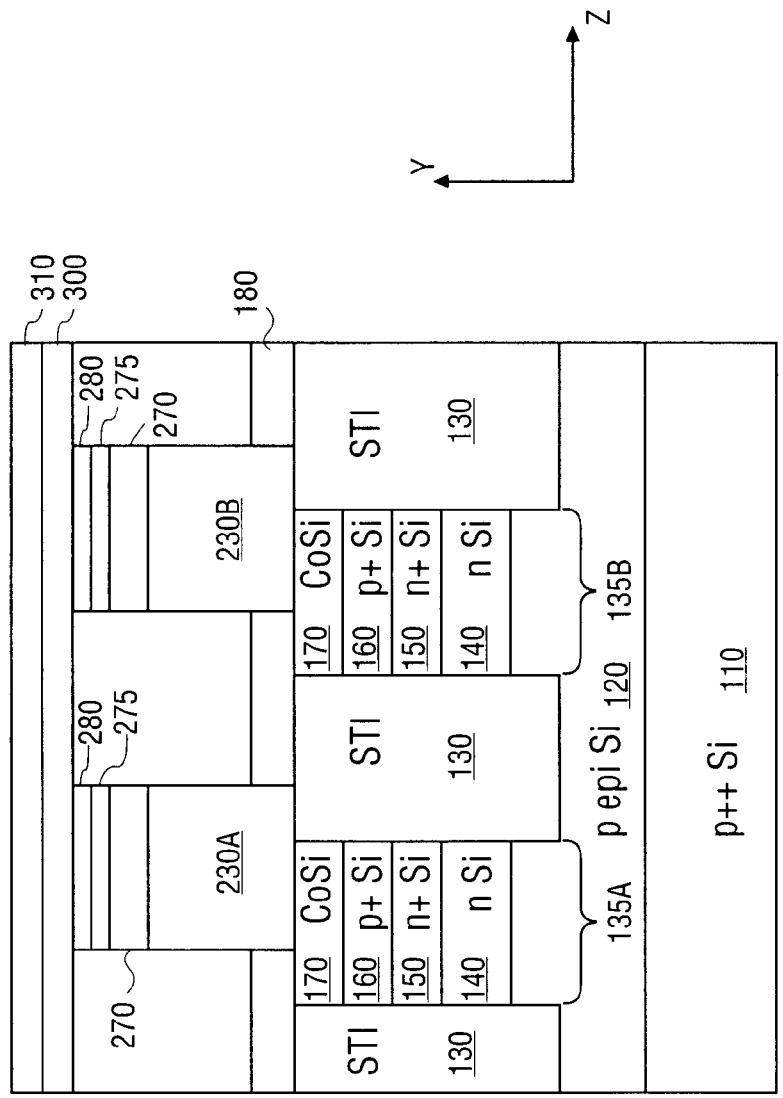
FIG. 8 shows a cross-sectional planar side view of the structure of FIG. 6 through line B–B' following the forming of a first dielectric material layer and a sacrificial layer over the substrate.

In either the representation shown in FIG. 6 or in FIG. 7, it is desired to decrease the contact area of the electrode material with the programmable material, preferably beyond the limits established by photolithography. FIGS. 8–19 describe a process whereby the contact area may be minimized. FIG. 8 shows the structure of FIG. 6 through lines B–B'. Following the patterning of the electrode material into minimum feature size structures.

Over the planarized superior surface in FIG. 8, first dielectric material 300 is formed. First dielectric layer 300 is, for example, silicon dioxide deposited by CVD. A thickness on the order of 350 Å or less is suitable. Formed on first dielectric layer 300 in FIG. 8 is sacrificial layer 310. In one example, sacrificial layer 310 is a material having a different etch characteristic than first dielectric layer 300 (e.g., for a particular etch chemistry, one of first dielectric layer 300 or sacrificial layer 310 may be selectively etched (removed) to the (virtual) exclusion of the other of first dielectric layer 300 and sacrificial layer 310). A suitable material for sacrificial layer 310 where first dielectric layer 300 is $SiO_2$ is, for example, polycrystalline silicon (polysilicon). In one example, sacrificial layer 310 of polysilicon is deposited by CVD to a thickness on the order of 1,000 Å.

Figure 9:
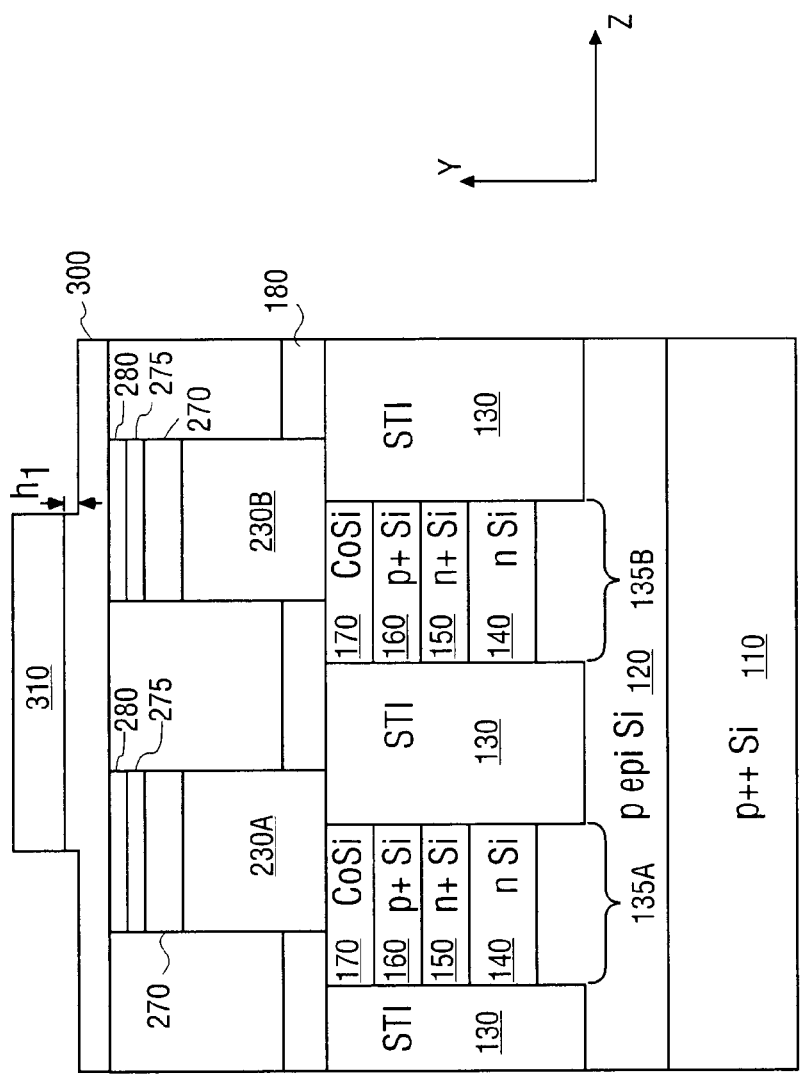
FIG. 9 shows the structure of FIG. 8 following the patterning of the sacrificial material to overly portion of an electrode.

FIG. 9 shows the structure of FIG. 8 following the patterning of sacrificial layer 310. In this embodiment, sacrificial layer 310 is patterned such that a body of sacrificial material overlies, in this view, less than the entire portion of the electrode material over which is formed. In FIG. 9, the body of sacrificial layer 310, as patterned, overlies a portion (less than the entire portion) of adjacent electrode material structures. Sacrificial layer 310 may be patterned to overlie a portion of electrode material structures by photolithography techniques and etch patterning may be employed to remove the sacrificial material from other areas. FIG. 9 also shows an etch to remove sacrificial material over a portion of each of the viewed electrode material portions proceeds partially into first dielectric layer 300. Etching a distance, $h_1$, into first dielectric layer 300, on the order of about 25 Å or less serves, in one aspect, to inhibit undercutting in later processing.

Figure 10:
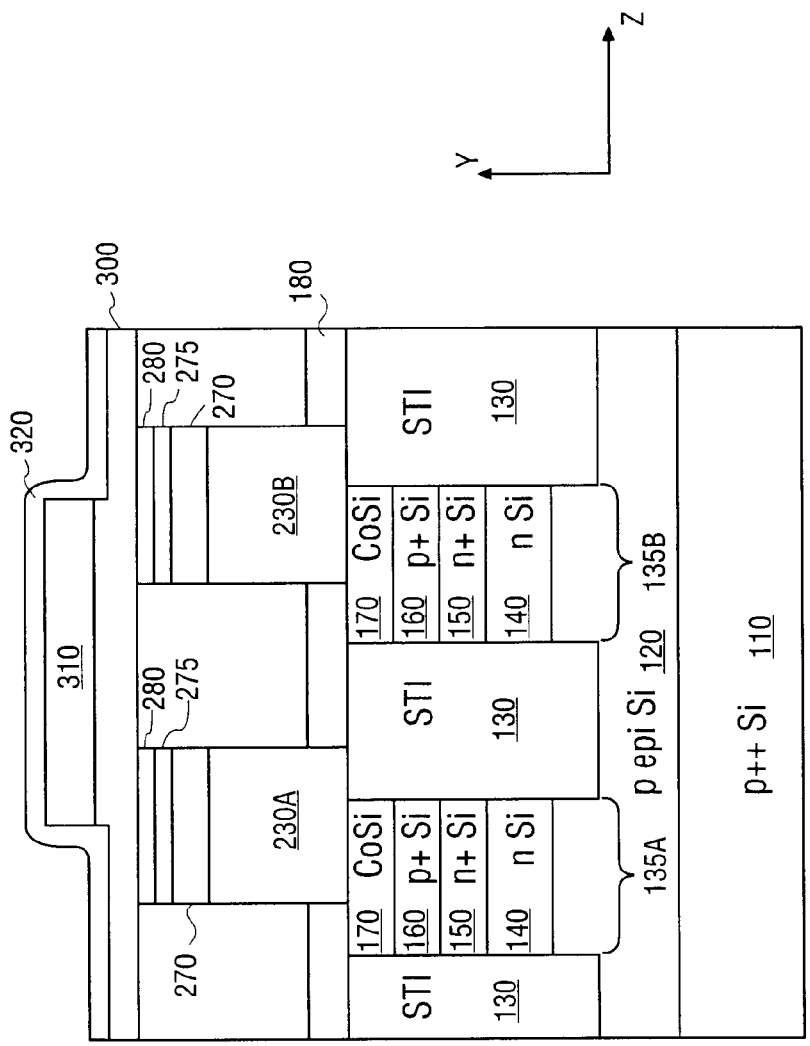
FIG. 10 shows the structure of FIG. 9 following the introduction of a second dielectric layer.

FIG. 10 shows the structure of FIG. 9 following the introduction of spacer material 320. In this example, spacer material 320 is deposited conformally over the superior surface of the structure, including over sacrificial material 310 and first dielectric layer 300. Spacer material 320 is, for example, a material similar to first dielectric layer 300 (an oxide) deposited to a thickness, in this example, on the order of about 350 Å on the side walls of sacrificial material 310. This can be achieved, for example, by low pressure CVD (LPCVD) targeted to a layer or film thickness of about 450 Å to 500 Å.

Figure 11:
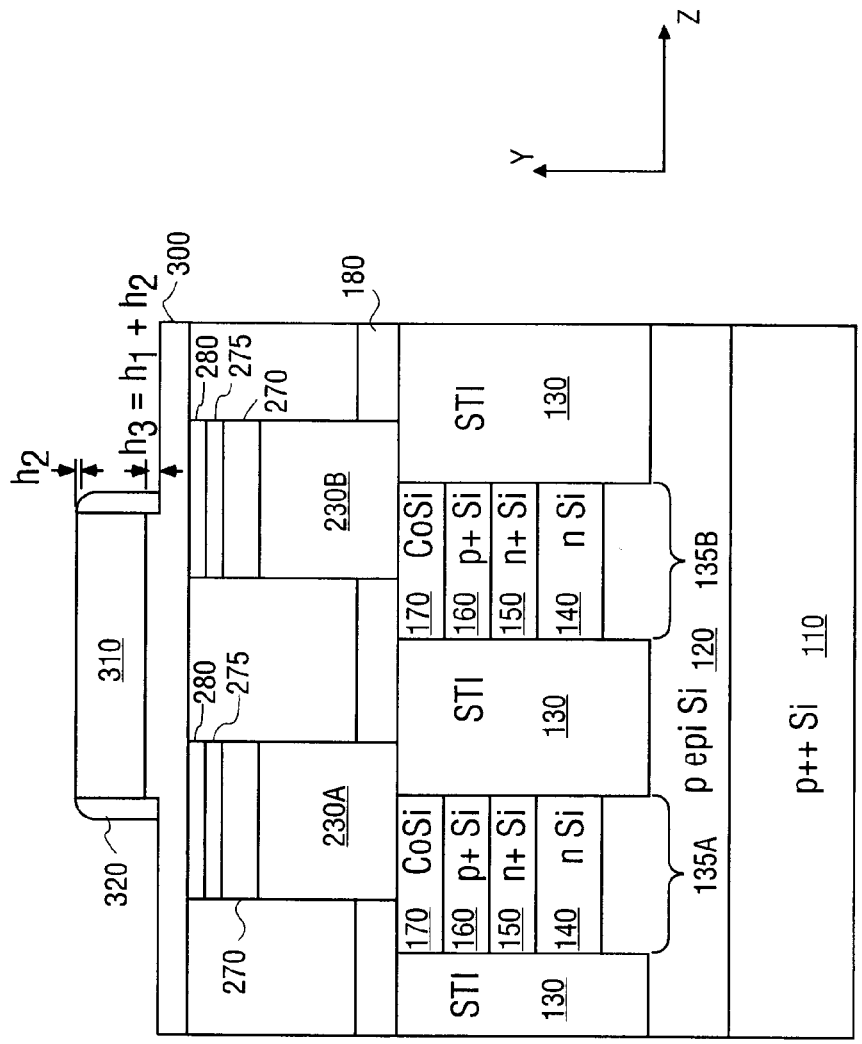
FIG. 11 shows the structure of FIG. 10 following the anisotropic spacer etch to expose the sacrificial material.

FIG. 11 shows the structure of FIG. 10 following an anisotropic etch of spacer material 320 to expose sacrificial material 310. An anisotropic etch retains spacer material 320 along the side walls (the y-direction side walls) of sacrificial material 310 but the lateral portions (in this view) along the z-direction of spacer material 320 are removed. Accordingly, in this example, approximately 350 Å thickness of spacer material is retained on the side walls of sacrificial material 310. As shown in FIG. 11, the removal of spacer material by, for example, an anisotropic etch may proceed into a portion of first dielectric layer 300 (e.g., to a depth on the order of about 25 Å) so that a thickness, $h_3$, of first dielectric layer 300 is removed, equivalent to the amount, $h_1$, removed in patterning sacrificial material 310 plus the amount, $h_2$, removed in the removal of spacer material 320.

Figure 12:
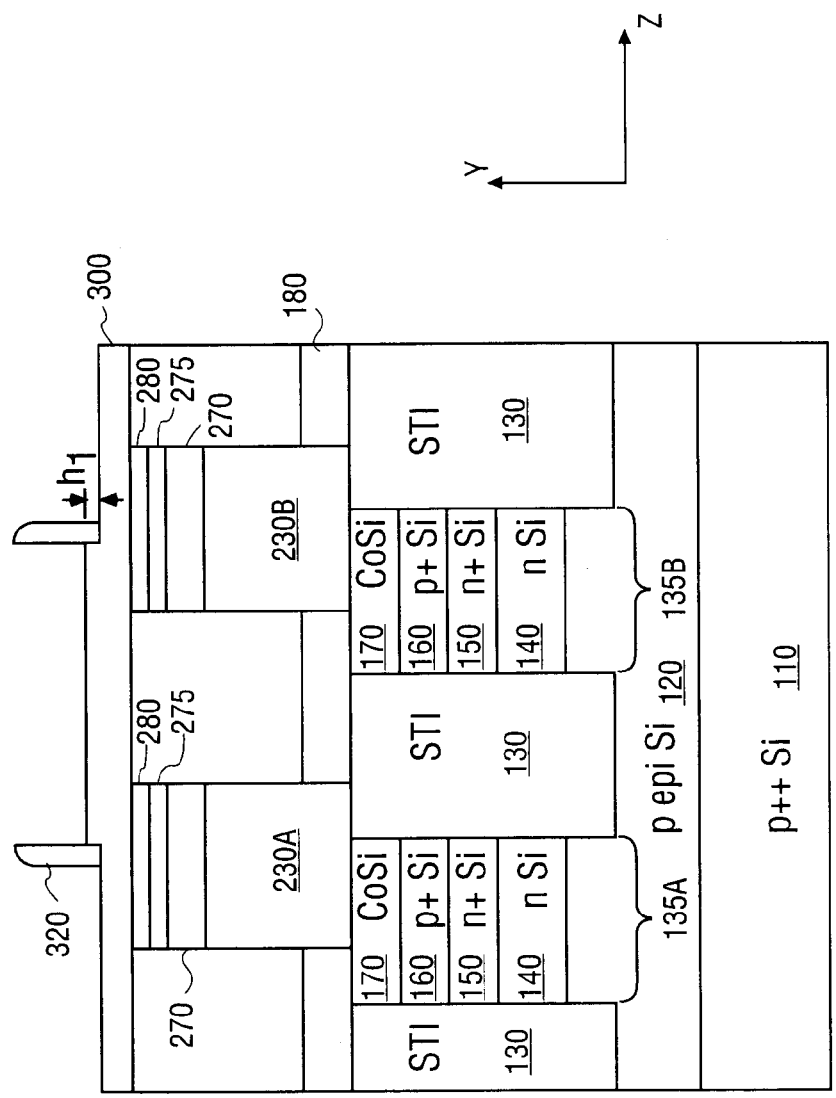
FIG. 12 shows the structure of FIG. 11 following the removal of the sacrificial material.

FIG. 12 shows the structure of FIG. 11 following the removal of sacrificial material 310. In one embodiment, sacrificial material 310 of polysilicon may be removed by an isotropic dry etch using, for example, an etch chemistry of $SF_6/He/O_2$ or $CF_4/O_2$ or a selective wet etch process. Following the removal of sacrificial material 310, there remains over the superior surface of the structure (as viewed) first dielectric layer 300 and vertical (y-direction) spacer portion 320 disposed over a portion of electrode material.

Figure 13:
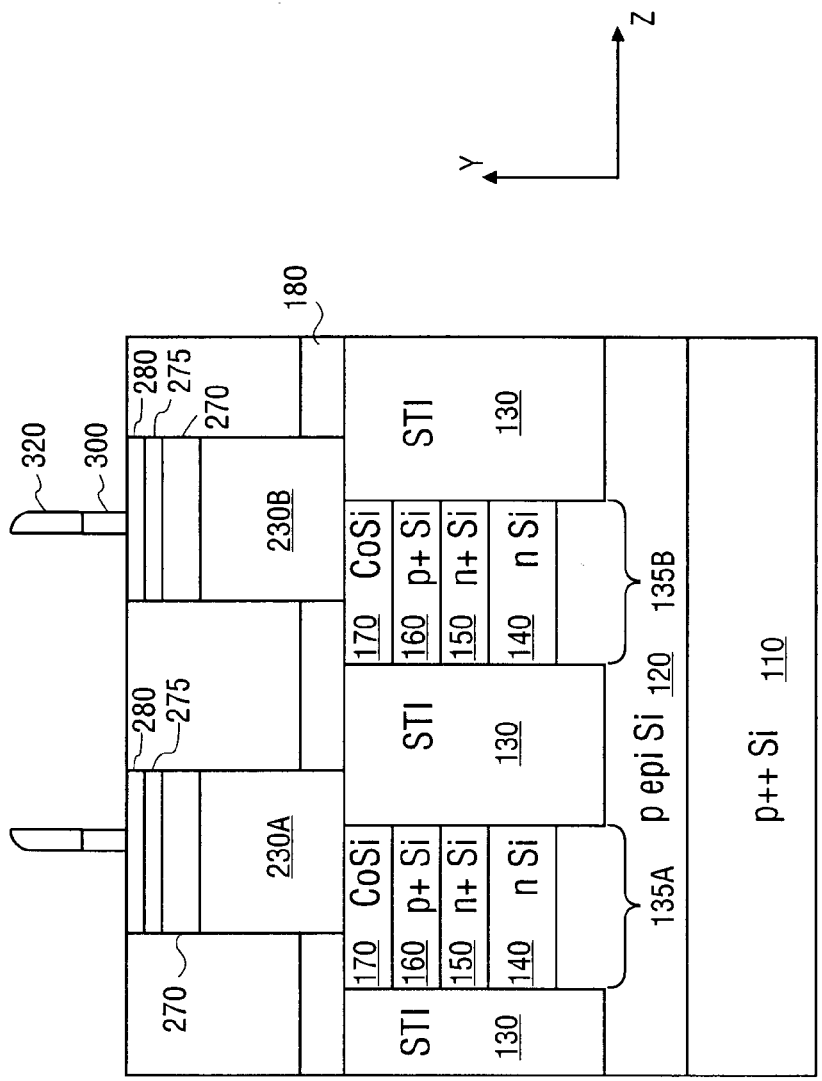
FIG. 13 shows the structure of FIG. 12 following the blanket anisotropic etch of the first dielectric material layer.

FIG. 13 shows the structure of FIG. 12 following the removal of the portion of first dielectric material layer 300 to expose a portion of the electrode material while retaining some portion of the vertically-disposed spacer material 320. In the example where spacer material 320 and first dielectric material layer 300 are each silicon dioxide, an anisotropic etch to remove first dielectric layer 300 may be utilized. It is appreciated that the combined vertical (y-direction) thickness of spacer material 320 and first dielectric material layer 300 such that using an anisotropic etch of, for example, a $CF_4/H_2$ or $CHF_3/H_2$ chemistry to expose the electrode material may be accomplished without completely removing spacer material 320.

Figure 14:
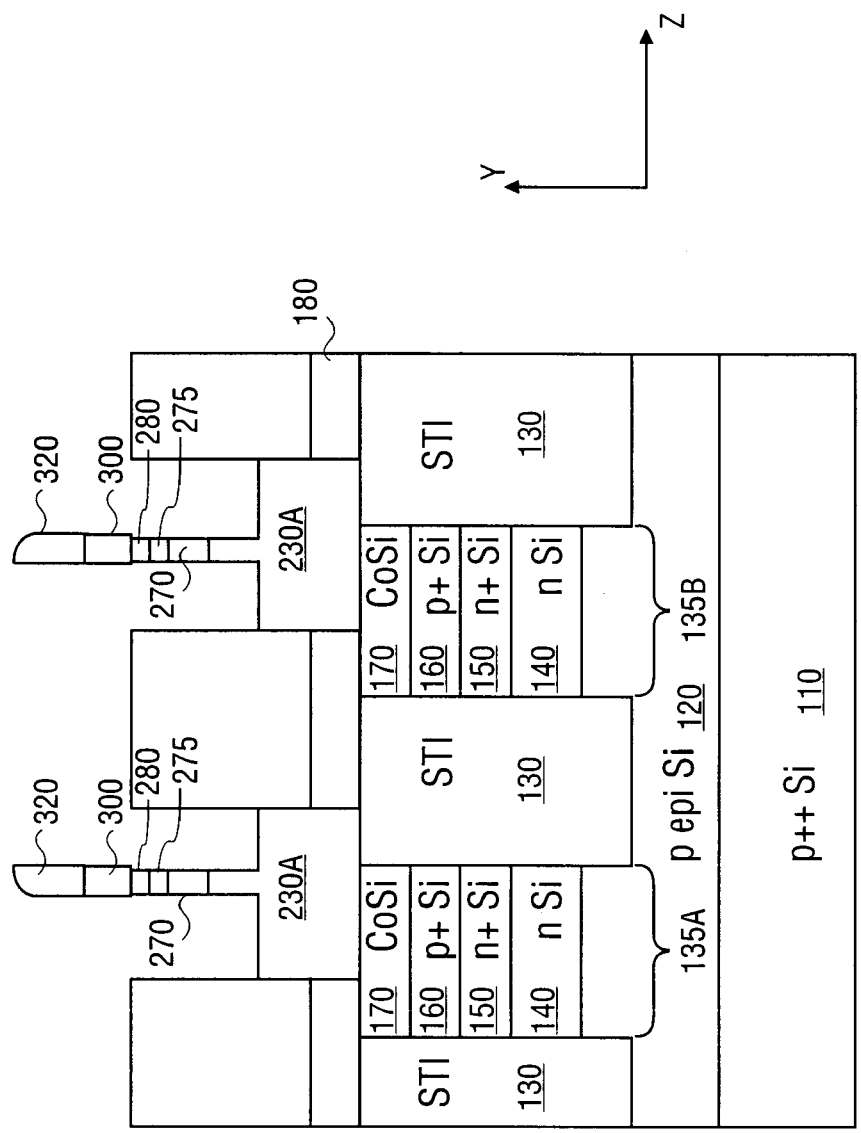
FIG. 14 shows the structure of FIG. 13 after optionally recessing a portion of electrode material.

FIG. 14 shows an optional processing operation whereby to the structure shown in FIG. 13, a portion of the electrode material is recessed below the non-planar superior surface of the structure (as viewed). In the example where electrode material is predominantly polycrystalline silicon, an anisotropic etch, of $CF_4/O_2$ or $SF_6/He/O_2$, is suitable. In an example where the electrode material has a y-direction thickness on the order of 5,000 Å, an etch to remove approximately 1,200 Å is suitable. The etch is selective for the electrode material and, therefore, spacer material 320 and remaining first dielectric layer portion 300 are retained as is the portion of electrode material directly beneath (in this view) spacer material 320 and first dielectric material layer 300. Following recessing electrode material, the opening surrounding the retained electrode material post may be filled to the superior surface with dielectric material, e.g., CVD deposition of $SiO_2$ (not shown).

Figure 15:
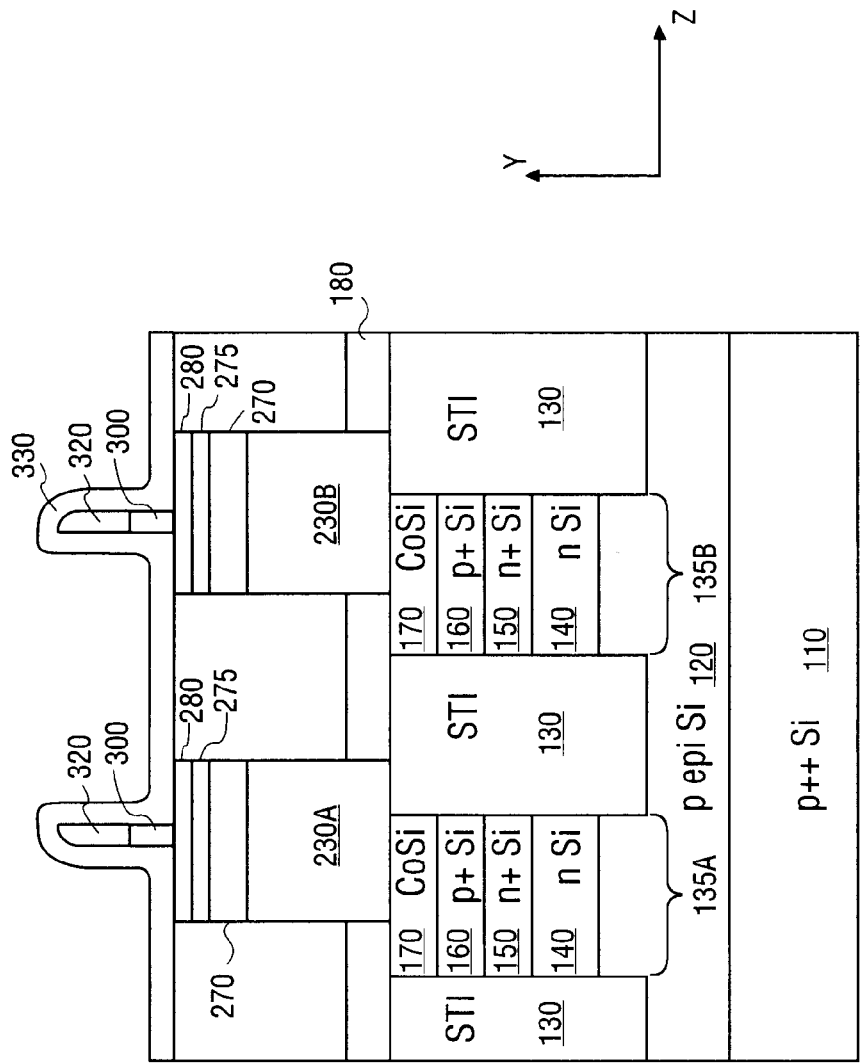
FIG. 15 shows the structure of FIG. 14 following the introduction of third dielectric material layer over the structure.

FIG. 15 shows the structure of FIG. 13 following the introduction of second dielectric layer 330 over the structure. In one embodiment, second dielectric layer 330 is of a material having a different etch characteristic than first dielectric layer 300 and, optionally, spacer material 320. Where spacer material 320 and first dielectric layer 300 are each silicon dioxide, second dielectric layer 330 is, for example, silicon nitride.

Second dielectric layer 330 is introduced such as by low pressure CVD (LPCVD) to a thickness on the order of 250 to 450 Å. The deposition is conformal such that it is introduced over the superior (lateral) surface of the structure (as viewed) as well as along the z-direction side walls of and over spacer material 320 (and first dielectric layer 300).

Figure 16:
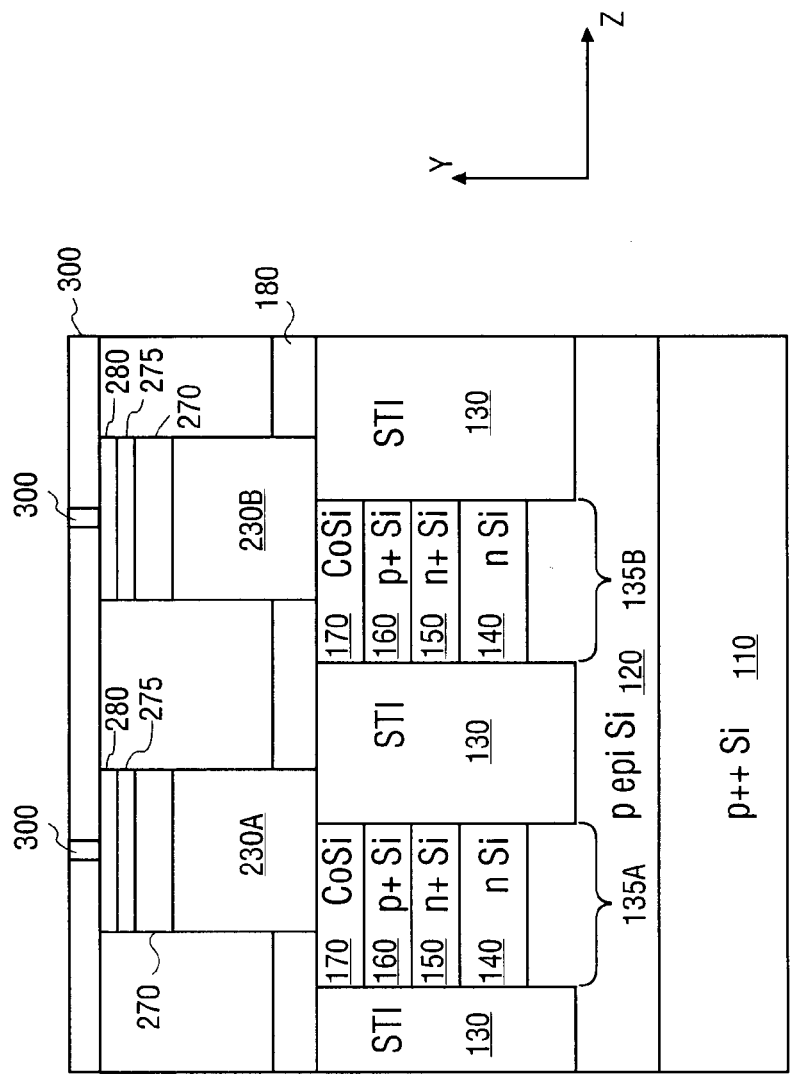
FIG. 16 shows the structure of FIG. 15 following the planarization of a surface of the structure.

FIG. 16 shows the structure of FIG. 15 following the planarization of the superior (in this view) surface of the structure. In one embodiment, the planarization may be achieved by a chemical mechanical polish (CMP) that removes spacer portion 320 and planarizes second dielectric layer 330 and remaining portions of first dielectric layer 300.

Figure 17:
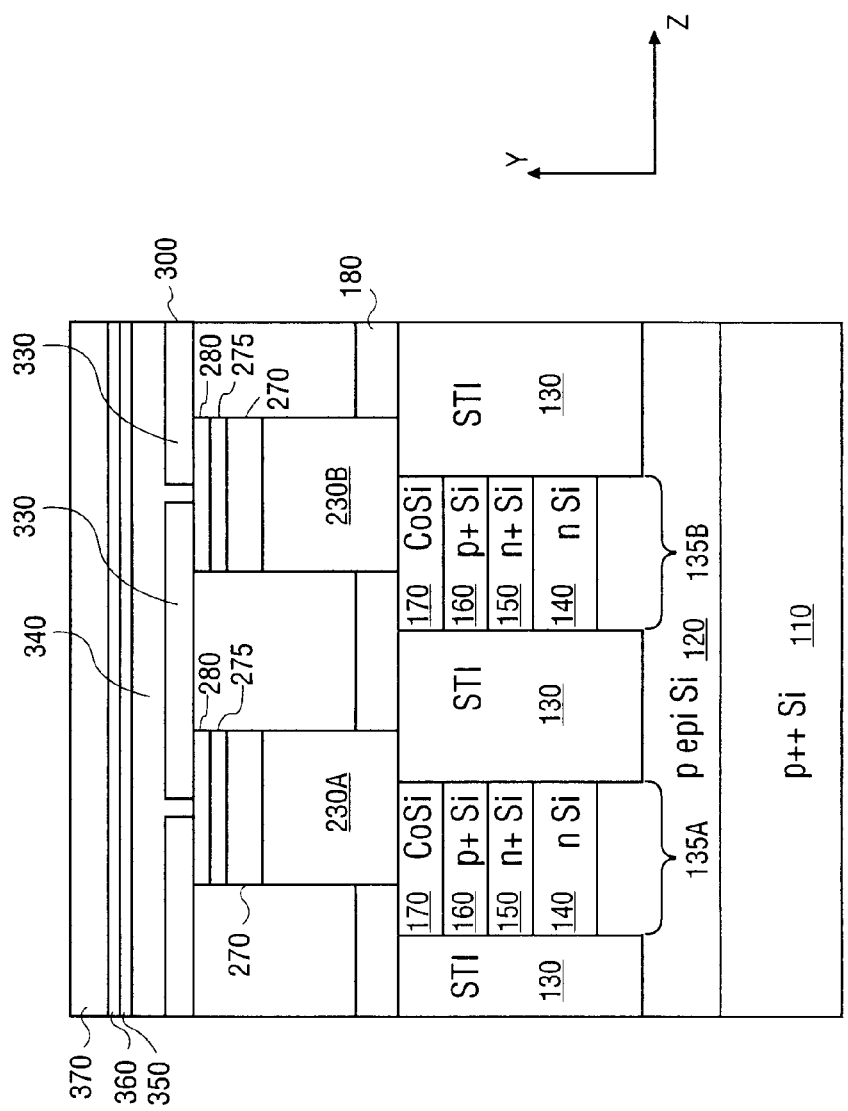
FIG. 17 shows the structure of FIG. 16 following the exposure of electrode material and the introduction of a phase change material and a second conductor or signal line.

FIG. 17 shows the structure of FIG. 16 following the removal of the remaining portions of first dielectric layer 300 to expose electrode material. The majority of the surface (the contact area) of the electrode material is covered by second dielectric layer 330. The exposed portion of the contact area, in this example, is on the order of about 350 Å, equivalent to the thickness of the y-direction portions of spacer material 320 layer or film (see FIG. 10 and the accompanying text) Where first dielectric is silicon dioxide, a wet etch of 50 to one $H_2O$ to HF may be used to remove the dielectric material.

Referring to FIG. 17, following the removal of dielectric material, a layer of programmable material 340 is introduced. In one example, programmable material 340 is a phase change material. In a more specific example, programmable material 340 includes a chalcogenide element(s). Examples of phase change programmable material 340 include, but are not limited to, compositions of the class of tellerium-germanium-antimony ($Te_xGe_ySb_z$) material. Programmable material 340, in one example according to current technology, is introduced to a thickness on the order of about 600 Å.

Figure 18:
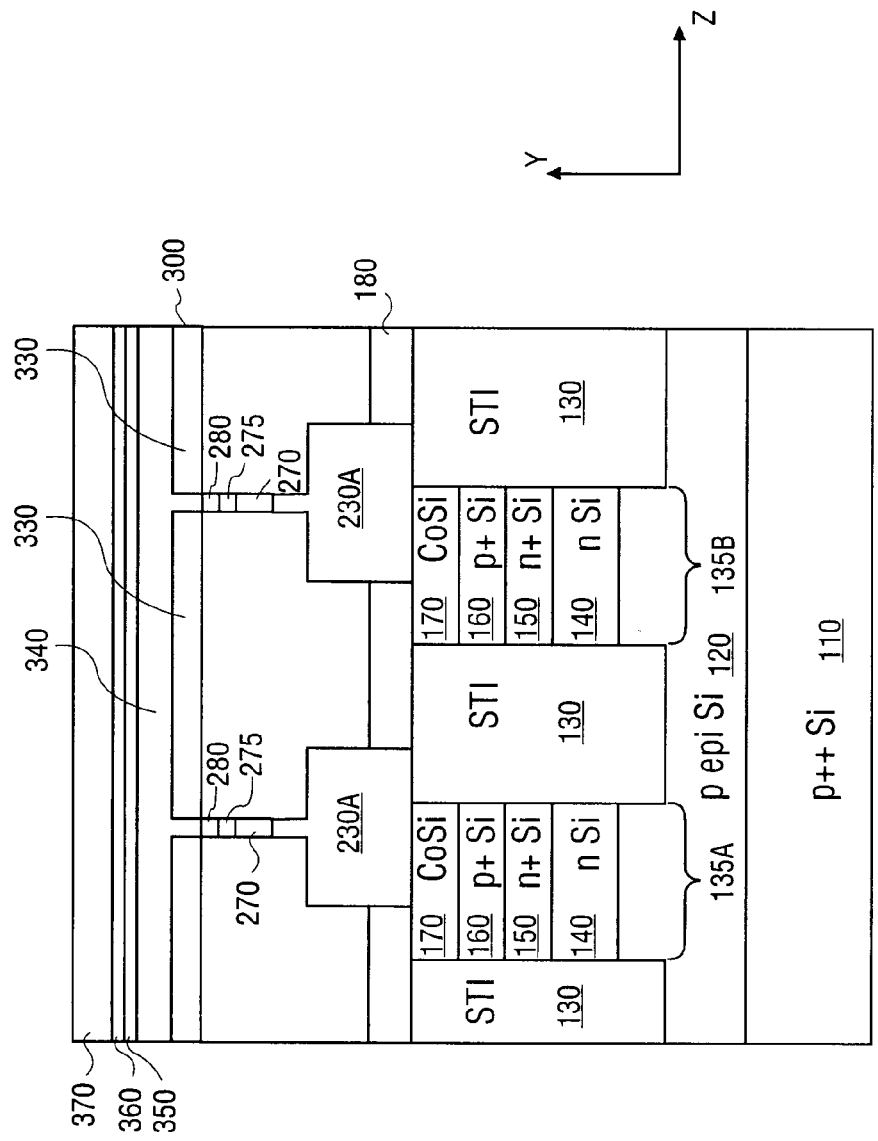
FIG. 18 shows the structure of FIG. 14 following the introduction of third dielectric material, the planarization of the surface of the structure, the exposure of electrode material, and the introduction of a phase change material and a second conductor signal line in accordance with a second embodiment.
Figure 19:
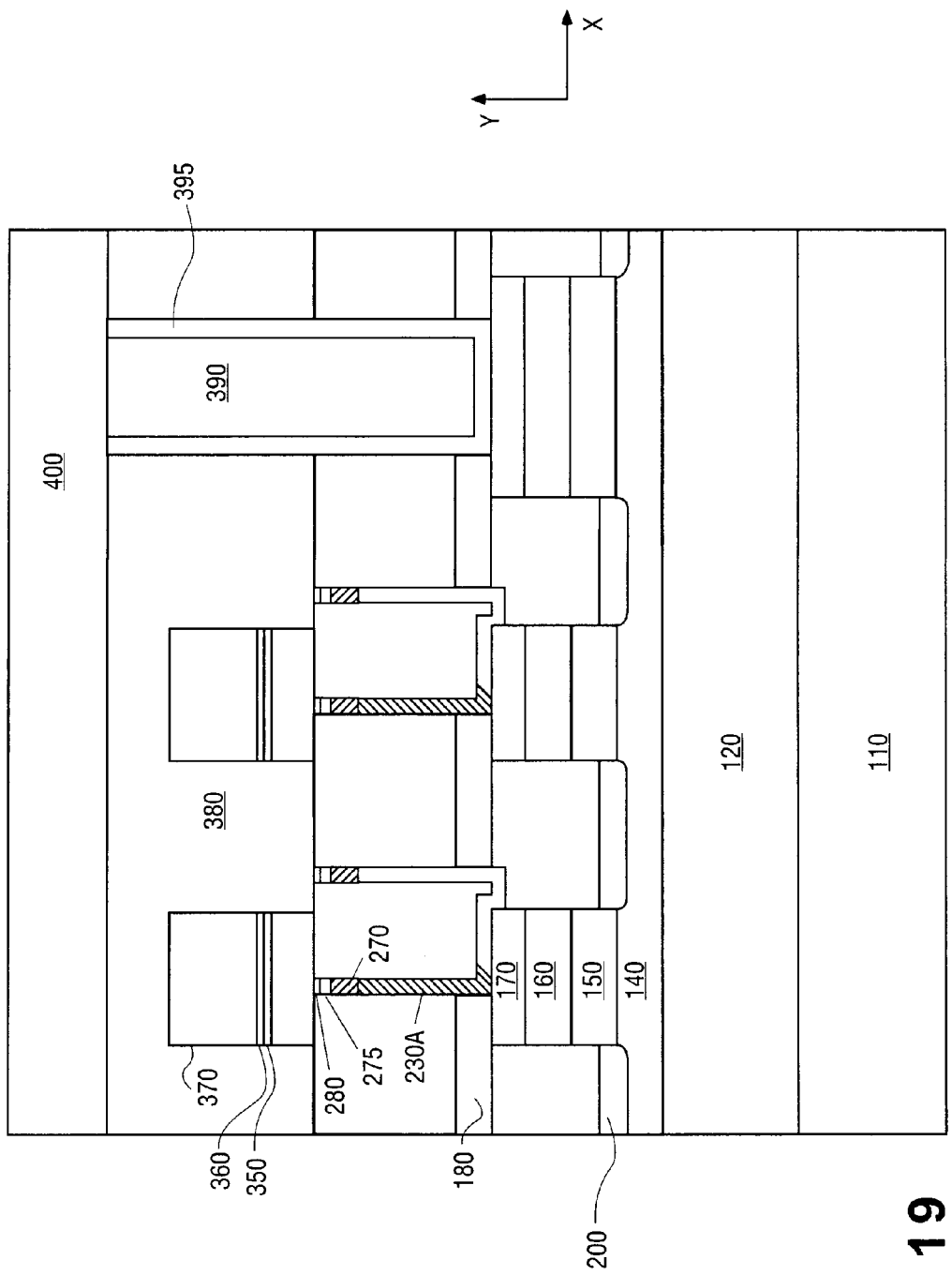
FIG. 19 shows the structure of FIG. 17 through a different cross section.

Overlying programmable material 340 in the structure of FIG. 17 are barrier materials 350 and 360 of, for example, titanium (Ti) and titanium nitride (TiN), respectively. Overlying barrier materials 350 and 360 is second conductor or signal line material 370. Barrier material serves, in one aspect, to inhibit diffusion between the volume of programmable material 340 and second conductor or signal line material 370 overlying the volume of programmable material 340. In this example, second conductor or signal line material 370 serves as an address line, a column line (e.g., column line 10 of FIG. 1). Second conductor or signal line material 370 is, for example, an aluminum material, such as an aluminum alloy. As shown in FIG. 19, second conductor or signal line material 370 is patterned to be, in one embodiment, generally orthogonal to first conductor or signal line 140. FIG. 18 is a similarly formed structure wherein a portion of the electrode material is recessed below programmable material 340.

FIG. 19 is an xy-direction cross-section of the structure shown in FIG. 17 or FIG. 18. It is to be appreciated at this point that programmable material 340 may be patterned contiguously with second conductor or signal line material 370 such that programmable material 340 is itself strips (like second conductor or signal line material 370) or is in a cellular form (achieved by patterning prior to patterning second conductor or signal line material 370).

FIG. 19 also shows the structure of FIG. 17 after the introduction of dielectric material 380 over second conductor or signal line material 370. Dielectric material 380 is, for example, $SiO_2$ or other suitable material that surrounds second conductor or signal line material 370 and programmable material 340 to electronically isolate such structure. Following introduction, dielectric material 380 is planarized and a via is formed in a portion of the structure through dielectric material 380, dielectric material 210, and masking material 180 to reducer material 170. The via is filled with conductive material 390 such as tungsten (W) and barrier material 395 such as a combination of titanium (Ti) and titanium nitride (TiN).

The structure shown in FIG. 19 also shows additional conductor or signal line material 400 introduced and patterned to mirror that of first conductor or signal line material 140 (e.g., row line) formed on substrate 100. Mirror conductor line material 400 mirrors first conductor or signal line material 140 and is coupled to first conductor or signal line material 140 through a conductive via. By mirroring a doped semiconductor such as N-type silicon, mirror conductor line material 400 serves, in one aspect, to reduce the resistance of conductor or signal line material 140 in a memory array, such as memory array 5 illustrated in FIG. 1. A suitable material for mirror conductor line material 320 includes an aluminum material, such as an aluminum alloy.

In memory element 15 of FIG. 1 and an embodiment fabricated in accordance with techniques described in FIGS. 2–19, the electrode delivers electrical current to the programmable material. As the electrical current passes through the electrode and through the programmable material, at least a portion of the electric energy of the electrons is transferred to the surrounding material as heat. That is, the electrical energy is converted to heat energy via Joule heating. While not wishing to be bound by theory, it is believed that dissipating power in the electrical contact from Joule heating adjacent to the programmable material may at least partially assist (or may even dominate) the programming of the programmable material. With phase change materials such as chalcogenide materials, a very small volume of material may be phase-changed (e.g., from crystalline to amorphous or vice versa) and dramatically affect the resistance from the one electrode (e.g., signal line) through the programmable material to a second electrode (e.g., signal line). Hence, providing a reduced contact area adjacent to the programmable material reduces the volume of programmable material that is modified and may thus decrease the total power and energy needed to program the device.

Figure 20:
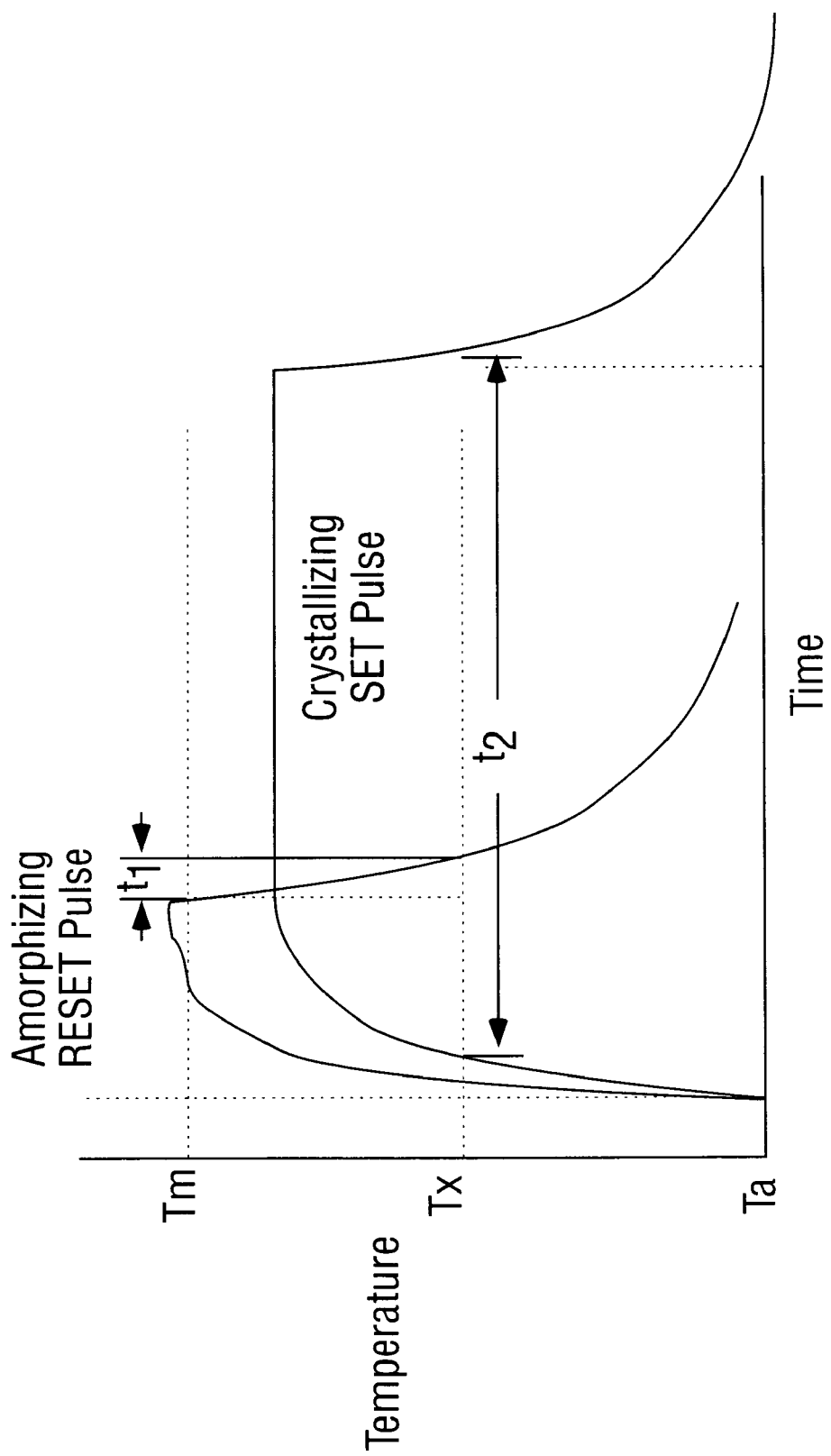
FIG. 20 shows a graphical representation of setting and resetting a volume of programmable material in terms of temperature and time.

FIG. 20 presents a graphical representation of the programming (e.g., setting and resetting) of a volume of programmable material that is a chalcogenide material. Referring to FIG. 1, programming memory element 15 (addressed by column line 10a and row line 20a) involves, in one example, supplying a voltage to column line 10a to introduce a current into the volume of programmable material 30. While not to be wishing bound by theory, the current causes a temperature increase at the volume of programmable material 30 due, it is believed, to Joule heating. Referring to FIG. 20, to amorphize a volume of programmable material, the volume of memory material is heated to a temperature beyond the amorphizing temperature, $T_M$ (e.g., beyond the melting point of the memory material). A representative amorphizing temperature for a $Te_xGe_ySb_z$ material is on the order of about 600–650° C. Once a temperature beyond $T_M$ is reached, the volume of memory material is quenched or cooled rapidly (by removing the current flow). The quenching is accomplished at a rate, $t_1$, that is faster than the rate at which the volume of programmable material 30 can crystallize so that the volume of programmable material 30 retains its amorphous state. To crystallize a volume of programmable material 30, the temperature is raised by current flow to the crystallization temperature for the material (representatively a temperature between the glass transition temperature of the material and the melting point) and retained at that temperature for a sufficient time to crystallize the material. After such time, the volume of programmable material is quenched (by removing the current flow).

In the preceding example, the volume of programmable material 30 was heated to a high temperature to amorphisize the material and reset the memory element (e.g., program 0). Heating the volume of programmable material to a lower crystallization temperature crystallizes the material and sets the memory element (e.g., program 1). It is to be appreciated that the association of reset and set with amorphous and crystalline material, respectively, is a convention and that at least an opposite convention may be adopted. It is also to be appreciated from this example that the volume of memory material 30 need not be partially set or reset by varying the current flow and duration through the volume of memory material.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method comprising:

forming a sacrificial layer over less than the entire portion of a contact area on a substrate, the sacrificial layer having a thickness defining an edge over the contact area;

forming a spacer layer over the spacer, the spacer layer conforming to the shape of the first sacrificial layer such that the spacer layer comprises an edge portion over the contact area adjacent the first sacrificial layer edge;

removing the sacrificial layer;

while retaining the edge portion of the spacer layer over the contact area, forming a dielectric layer over the contact area;

removing the edge portion; and forming a programmable material to the contact area formerly occupied by the edge portion.

2. The method of claim 1, wherein the contact area is a portion of an electrode formed to a first contact point on the substrate, the method further comprising:

forming a second contact point to the programmable material.

3. The method of claim 1, wherein the dielectric layer and the spacer layer comprise materials having different etch characteristics such that the spacer layer can be removed exclusive of the dielectric layer.

4. The method of claim 1, wherein forming the spacer layer comprises depositing the spacer layer over the sacrificial layer and, after depositing, exposing the sacrificial layer.

5. The method of claim 4, wherein exposing the sacrificial layer comprises anisotropically etching the spacer layer.

6. A method comprising:

over an electrode formed to a first contact point on a substrate, the electrode having a first contact area, forming a first dielectric layer;

forming a sacrificial layer on the first dielectric layer;

patterning the sacrificial layer into a body;

forming at least one spacer along a side wall of the sacrificial body, the at least one spacer overlying a portion of the first contact area;

after forming the at least one spacer, removing the sacrificial body;

conformally forming a second dielectric layer on the first contact area;

exposing the at least one spacer;

removing the at least one spacer;

exposing a second contact area of the electrode, the second contact area within the first contact area; and forming a material comprising a second contact point to the second contact area.

7. The method of claim 6, further comprising removing the at least one spacer after exposing the at least one spacer.

8. The method of claim 1, wherein a material for the first dielectric layer and a material for the at least one spacer comprise a similar etch characteristic.

9. The method of claim 7, wherein a material for the second dielectric layer comprises a different etch characteristic than a material for the first dielectric layer.

10. The method of claim 6, wherein forming a material comprising a second contact point comprises forming a programmable material within the second contact area.

11. The method of claim 1, wherein forming the at least one spacer comprises conformally depositing a layer of spacer material over the sacrificial body and then exposing a surface of the sacrificial body.

12. The method of claim 11, wherein exposing the surface of the sacrificial body comprises anisotropically etching the layer of spacer material.

13. The method of claim 6, wherein after removing the sacrificial body, the method further comprises exposing a portion of the first area exclusive of an area covered by the at least one spacer.

14. The method of claim 13, further comprising recessing the exposed surface of the electrode.

* * * * *